(12) United States Patent
Yu et al.

(10) Patent No.: US 10,096,690 B2
(45) Date of Patent: Oct. 9, 2018

(54) CIRCUIT STRUCTURE, TRANSISTOR AND SEMICONDUCTOR DEVICE

(71) Applicant: Taiwan Semiconductor Manufacturing Company, Ltd., Hsin-Chu (TW)

(72) Inventors: Jiun-Lei Jerry Yu, Hsinchu County (TW); Fu-Wei Yao, Hsinchu (TW); Chen-Ju Yu, Yilan County (TW); Chun-Wei Hsu, Hsinchu (TW); King-Yuen Wong, Tuen Mun (HK)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/412,924

(22) Filed: Jan. 23, 2017

(65) Prior Publication Data
US 2017/0133484 A1    May 11, 2017

Related U.S. Application Data

(60) Continuation of application No. 14/827,839, filed on Aug. 17, 2015, now Pat. No. 9,553,182, which is a (Continued)

(51) Int. Cl.
*H01L 21/28* (2006.01)
*H01L 27/092* (2006.01)
(Continued)

(52) U.S. Cl.
CPC .... *H01L 29/66462* (2013.01); *H01L 21/0254* (2013.01); *H01L 21/0262* (2013.01);
(Continued)

(58) Field of Classification Search
CPC ..... H01L 21/28; H01L 27/092; H01L 21/335; H01L 31/00; H01L 31/0328; H01L 21/338; H01L 21/8238; H01L 29/76; H01L 29/78; H01L 21/336
USPC ... 257/194, 369, E21.19, E21.403, E27.062, 257/459, 750, 401, 341, 342, 365, 76, 257/E29.262, E21.41; 438/590, 312, 235, 438/172, 193, 195, 284, 282, 280, 270
See application file for complete search history.

(56) References Cited

U.S. PATENT DOCUMENTS 6,313,512 B1    11/2001    Schmitz et al.
6,541,346 B2    4/2003    Malik et al.
(Continued)

*Primary Examiner* — Mouloucoulaye Inoussa
(74) *Attorney, Agent, or Firm* — Haynes and Boone, LLP

(57) ABSTRACT

A circuit structure includes a substrate, a III-V semiconductor compound over the substrate, a $Al_xGa_{(1-x)}N$ (AlGaN) layer over the III-V semiconductor compound, a gate over the AlGaN layer, a passivation film over the gate and over a portion of the AlGaN layer, a source structure, and a drain structure on an opposite side of the gate from the source structure, wherein X ranges from 0.1 to 1. The source structure has a source contact portion and an overhead portion. The overhead portion is over at least a portion of the passivation film between the source contact portion and the gate. A distance between the source contact portion and the gate is less than a distance between the gate and the drain structure.

20 Claims, 9 Drawing Sheets

Related U.S. Application Data division of application No. 13/650,548, filed on Oct. 12, 2012, now Pat. No. 9,111,904.

(60) Provisional application No. 61/564,614, filed on Nov. 29, 2011.

(51) Int. Cl.

| | |
|---|---|
| *H01L 29/66* | (2006.01) |
| *H01L 29/778* | (2006.01) |
| *H01L 21/02* | (2006.01) |
| *H01L 29/20* | (2006.01) |
| *H01L 29/205* | (2006.01) |
| *H01L 29/40* | (2006.01) |
| *H01L 29/45* | (2006.01) |

(52) U.S. Cl.
CPC .... *H01L 21/02381* (2013.01); *H01L 29/2003* (2013.01); *H01L 29/205* (2013.01); *H01L 29/402* (2013.01); *H01L 29/452* (2013.01); *H01L 29/7787* (2013.01)

(56) References Cited

U.S. PATENT DOCUMENTS

| | | | |
|---|---|---|---|
| 6,580,107 B2 | 6/2003 | Asano et al. | |
| 7,071,526 B2 | 7/2006 | Ando et al. | |
| 7,608,497 B1* | 10/2009 | Milosavljevic | H01L 29/42316 257/E21.205 |
| 8,492,261 B2 | 7/2013 | Van Hove et al. | |
| 2002/0155691 A1* | 10/2002 | Lee | H01L 21/28575 438/604 |
| 2006/0118809 A1* | 6/2006 | Parikh | H01L 29/402 257/103 |
| 2013/0062614 A1 | 3/2013 | Tipirneni et al. | |
| 2013/0126889 A1* | 5/2013 | Bahl | H01L 29/66462 257/76 |

* cited by examiner

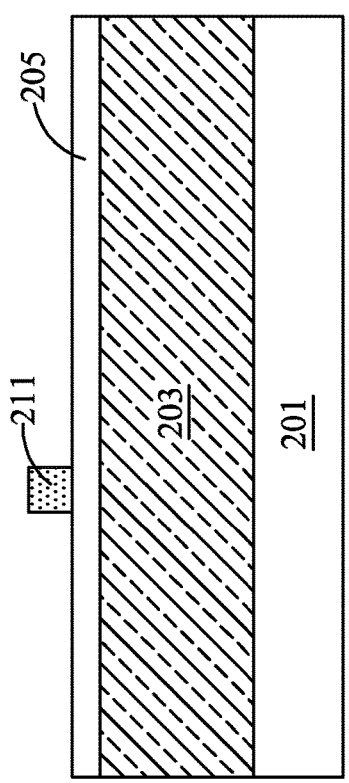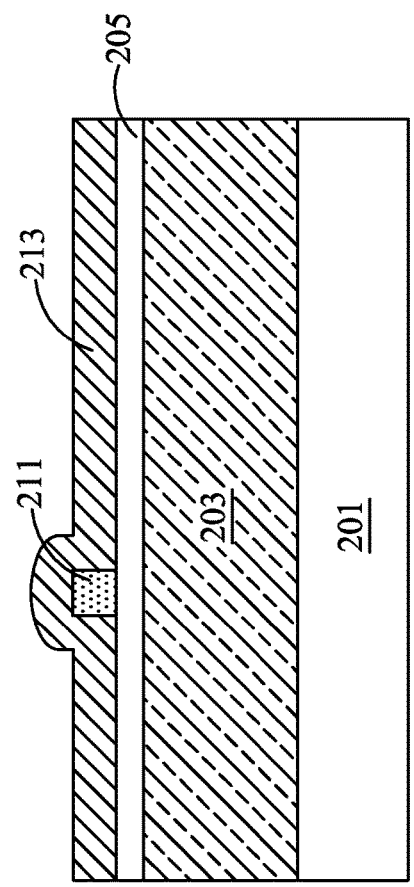

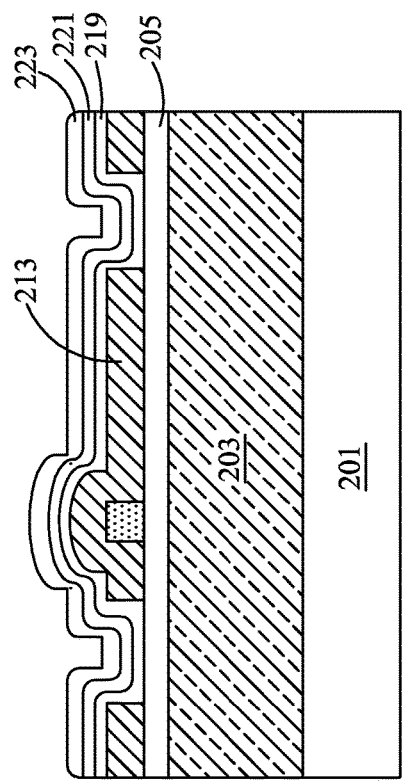
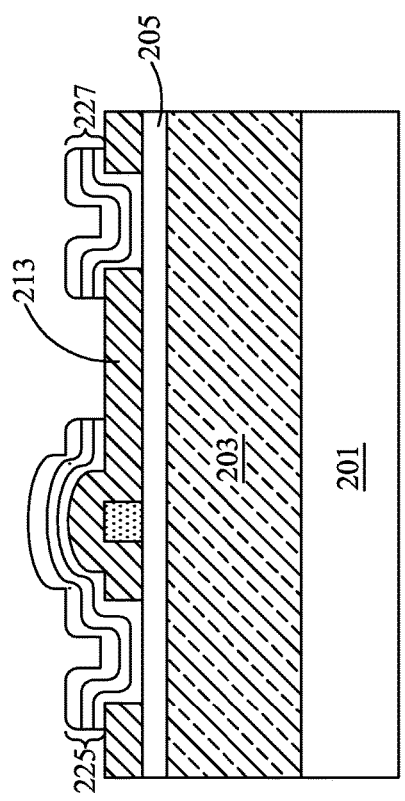
Fig. 7
Fig. 8

CIRCUIT STRUCTURE, TRANSISTOR AND SEMICONDUCTOR DEVICE

PRIORITY CLAIM

The present application is a continuation of U.S. application Ser. No. 14/827,839 issuing as U.S. Pat. No. 9,553,182, which is a divisional of U.S. application Ser. No. 13/650,548, filed Oct. 12, 2012, which claims priority of U.S. Provisional Application No. 61/564,614, filed Nov. 29, 2011, which are all incorporated herein by reference in their entireties.

TECHNICAL FIELD

This disclosure relates generally to semiconductor circuit manufacturing processes and, more particularly, to a group-III group-V (III-V) compound semiconductor based transistor.

BACKGROUND

Group-III group-V compound semiconductors (often referred to as III-V compound semiconductors), such as gallium nitride (GaN) and its related alloys, have been under intense research in recent years due to their promising applications in electronic and optoelectronic devices. The large band gap and high electron saturation velocity of many III-V compound semiconductors make them excellent candidates for applications in high temperature, high voltage, and high-speed power electronics. Particular examples of potential electronic devices employing III-V compound semiconductors include high electron mobility transistors (HEMTs) and other heterojunction transistors.

Typical III-V compound semiconductor manufacturing processes use a metal lift-off technique to form metal structures. Metal is deposited over a patterned photoresist that is subsequently removed, along with any metal deposited thereon. The photoresist and metal thereon are removed in a wet etch process. Some lift-off processes employ wet etchers using batch etchants. Thus a work piece may be in contact with etchants that includes removed material from a previous work piece. Use of batch etchants mean that process control and contamination can be issues with the metal lift-off process.

In order for the metal on the photoresist to be removed, a minimum amount of photoresist has to be used. Otherwise a metal bridge may remain on the work piece. Thus, the lift-off process results in a large distance between the source and the gate that contributes to on-resistance of the device and limits the drain current.

New structures and the methods for making them that have low on-resistance and high drain current continue to be sought.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 2 to 8 are cross-section views of a HEMT structure in various stages of fabrication in accordance with various embodiments of the present disclosure.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

A novel structure for group-III to group-V (referred to as III-V hereinafter) semiconductor based transistors and methods for forming the structures are provided. Throughout the description, the term "III-V compound semiconductor" refers to compound semiconductor materials comprising at least one group III element and one group-V element. The term "III-N compound semiconductor" refers to a III-V compound semiconductor in which the group V element is nitrogen. Example stages of manufacturing an illustrative embodiment of the present disclosure are discussed. Those skilled in the art will recognize that other manufacturing steps may need to take place before or after the described stages in order to produce a complete device. Other stages of manufacturing that may substitute for some of the example stages may be discussed. Those skilled in the art will recognize that other substitute stages or procedures may be used. Throughout the various views and illustrative embodiments of the present disclosure, like reference numbers are used to designate like elements.

The present disclosure provides a structure and a method to form III-V compound semiconductor based transistors having a short distance between an ohmic source contact and a gate ($L_{gs}$). A shorter $L_{gs}$ improves the on-resistance and drain current of the transistor. Further, the method allows an overhead portion of a source structure to be formed at the same time as the contact portion. The overhead portion of the source structure can be placed relatively close to the gate structure and improves the breakdown voltage by reducing surface electric field at the gate edge closest to the drain. The III-V compound semiconductor based transistor may be a high electron mobility transistor (HEMT).

Figure 1:
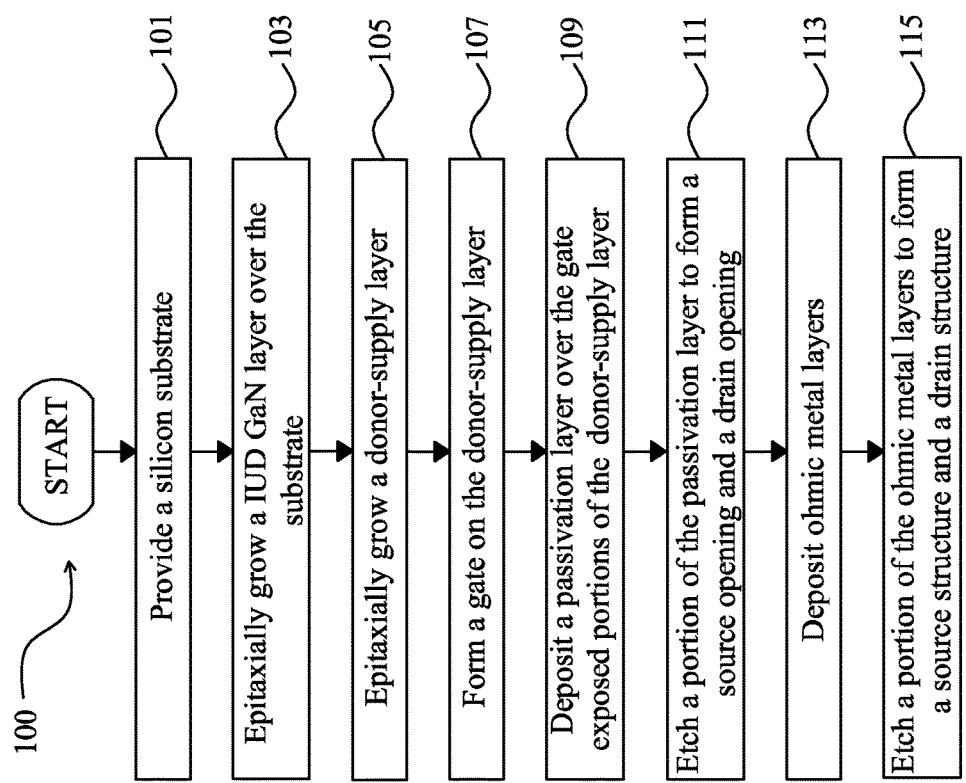
FIG. 1 is a flow chart of methods for forming a HEMT structure in accordance with various embodiments of the present disclosure.
Figure 2:
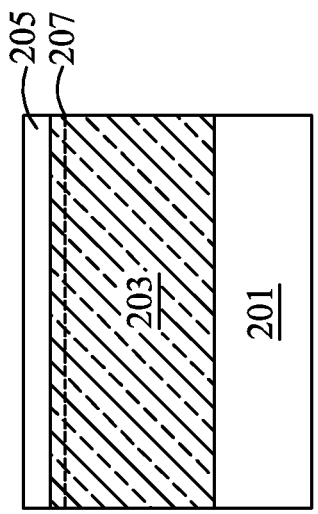
Figure 3:
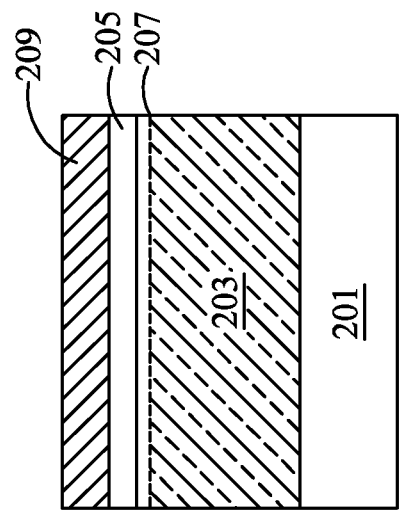

FIG. 1 shows a flowchart 100 for making a HEMT of the present disclosure. FIGS. 2 to 7 are cross-section views of the transistor structure in various stages of fabrication in accordance with various operations of the flowchart 100 of FIG. 1. In operation 101 of FIG. 1, a silicon substrate is provided. FIG. 2 shows the silicon substrate 201. Note that the various elements in the figures are not drawn to scale. While HEMTs are often manufactured on a substrate other than silicon substrate, such as sapphire and silicon carbide, the methods disclosed herein are specific to silicon fabrication processes. Using silicon fabrication processes, the structures disclosed herein may be formed on a substrate other than silicon. For example, other suitable substrates include silicon carbide and sapphire.

In operation 103, a layer of undoped gallium nitride is epitaxially grown over the silicon substrate. In FIG. 2, the layer of gallium nitride 203 is shown over the silicon substrate 201. The layer of gallium nitride 203 is not doped, but may include contaminants or impurities that are incorporated in the film unintentionally. The bulk layer of gallium nitride may be referred to as unintentionally doped gallium nitride (UID GaN) layer 203. The UID gallium nitride may be about 0.5 microns to about 5 microns thick. The bulk GaN layer is grown under high temperature conditions. The process may be metal organic CVD (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HYPE), chloride vapor-phase epitaxy (Cl-VPE), and liquid phase epitaxy (LPE). Embodiments using metal organic vapor phase epitaxy (MOVPE) use a gallium-containing precursor and a nitrogen-containing precursor. The gallium-containing precursor includes trimethylgallium (TMG), triethylgallium (TEG), or other suitable chemical. The nitrogen-containing precursor includes ammonia ($NH_3$), trimethylalaluminum (TMA), phenyl hydrazine, or other suitable chemical.

FIG. 2 shows an active layer 205 on top of the bulk GaN layer 203. The active layer 205, also referred to as donor-supply layer, is grown on the bulk GaN layer 203 in operation 105 of FIG. 1. In at least one embodiment, the donor-supply 205 refers to an aluminum gallium nitride (AlGaN) layer (also referred to as the AlGaN layer 205). The AlGaN layer 205 has a formula of $Al_xGa_{(1-x)}N$. It has a thickness in a range from about 5 nanometers to about 50 nanometers, wherein x varies between about between about 10% and 100%. In other embodiments, the donor-supply layer 205 may include an AlGaAs layer, or AlInP layer.

The AlGaN layer 205 can be epitaxially grown on the GaN layer 203 by MOVPE using an aluminum-containing precursor, a gallium-containing precursor, and a nitrogen-containing precursor. The aluminum-containing precursor includes TMA, TEA, or other suitable chemical. The gallium-containing precursor includes TMG, TEG, or other suitable chemical. The nitrogen-containing precursor includes ammonia, tertiarybutylamine (TBAm), phenyl hydrazine, or other suitable chemical.

Referring to FIG. 2, a band gap discontinuity exists between the AlGaN layer 205 and the GaN layer 203. The electrons from a piezoelectric effect in the AlGaN layer 205 drop into the GaN layer 203, creating a very thin layer 207 of highly mobile conducting electrons in the GaN layer 203. This thin layer 207 is referred to as a two-dimensional electron gas (2-DEG), forming a carrier channel (also referred to as the carrier channel 207). The thin layer 207 of 2-DEG is located at an interface of the AlGaN layer 205 and the GaN layer 203. Thus, the carrier channel 207 has high electron mobility because the GaN layer 203 is undoped or unintentionally doped, and the electrons can move freely without collision or substantially reduced collision with the impurities.

Referring to FIG. 1, a gate is formed on the donor-supply layer in operation 107. The gate includes a number of layers shown as layer 209 in FIG. 3. In some embodiments, an "epi wafer" is provided without any gate stack material. In other embodiments, the "epi wafer" is provided with a p-type doped gallium nitride (p-GaN) layer. The p-GaN layer may be about 300 angstroms to about 3000 angstroms thick. The p-type doping may occur by adding a dopant during the epitaxial growth process at a high temperature of between about 800 degrees Celsius and about 1200 degrees Celsius. P-type dopant candidates include carbon, iron, magnesium, calcium, beryllium, and zinc. The p-type doping may also occur by other processes such as ion implant; however, care must be taken not to incorporate the dopant in underlying layers, which may adversely affect the electrical properties of the transistor. The dopant concentration may be about $1E16/cm^3$ and $1E18/cm^3$. The different embodiments result in HEMTs having different properties referred to as depletion mode (d-mode) or enhanced mode (e-mode). The various aspects of the present disclosure apply to both types of the HEMTs.

Over the p-GaN layer or the donor-supply layer, one or more gate material layers including metals or other conductive materials are deposited to complete gate film layer 209. In various examples, the gate film stack metal layers may include a refractory metal or its compounds, e.g., tungsten (W), titanium nitride (TiN) and tantalum (Ta). Other commonly used gate metals include nickel (Ni) and gold (Au). Other gate film layers may be polysilicon. This part of the gate film layer may be about 300 angstroms to about 3000 angstroms thick. In addition to p-GaN and gate conductors, other material layers may be included in the gate stack. Examples include a thin dielectric film layer.

The refractory metals and its compounds in the gate film layer 209 may be deposited using a sputtering process at a process temperature of between about 200 degrees Celsius to about 450 degrees Celsius. Polysilicon may be deposited using chemical vapor deposition (CVD), for example, low pressure CVD, at about 600 degrees Celsius to about 800 degrees Celsius.

After the gate film layer 209 is deposited, a photoresist layer is patterned over the gate film layer 209. A photoresist material is deposited, usually by a spin coating process, and is cured. A portion of the photoresist material is exposed to radiation that changes material properties in the portion exposed. Then the photoresist material is developed to remove a portion of the photoresist, either the exposed portion or unexposed portion depending on the type of photoresist used. The photoresist pattern is thereby formed. In some embodiments, a hardmask layer is deposited first under the photoresist to better protect a portion of the gate film layer 209.

With a portion of the photoresist protecting the portion of the gate film layer 209, the workpiece is etched to define a gate 211, as shown in FIG. 4. A plasma etch removes unwanted portions of the gate film layer 209. Because the gate film layer includes different materials, different etchants or even different etch processes may be used. For example, if a hardmask is used, a different etch process is used first to define the gate by etching the hardmask. Then the metal or conductive material portions of the gate film layer 209 may be removed, for example, by an inductively coupled plasma (ICP) etch using a fluorine-based etchant, a bromine-based etchant, or a chlorine-based etchant. Another plasma etch process may be used to remove unwanted portions of the p-GaN layer, if any. In one example, the plasma etch process is a reactive ion etch process employing chlorine-containing etchants.

In some embodiments, the gate 211 is a gate stack including a p-GaN layer over the donor-supply layer 205 and one or more conductive material layers including tungsten, titanium, or titanium nitride. In other embodiments, the gate 211 is a gate stack that does not include a p-GaN layer over the donor-supply layer 205.

Referring to FIG. 1, in operation 109 a passivation layer is deposited over the gate and exposed portion of the donor-supply layer. The passivation layer 213 is shown in FIG. 5 deposited around gate 211 and over portions of the donor-supply layer 205. The passivation layer 213 may include one or more layers of dielectric material. The dielectric material may be silicon nitride, silicon oxide, silicon oxynitride, carbon doped silicon oxide, carbon doped silicon nitride or carbon doped silicon oxynitride deposited using a CVD process. For example a low pressure CVD (LPCVD) at between about 600 degree Celsius and about 800 degrees Celsius may be used to deposit 300 angstrom to about 4000 angstrom of silicon nitride. In another example, a plasma enhanced CVD (PECVD) process may be used at 200 degrees Celsius to about 450 degrees Celsius to deposit about 300 angstroms to about 4000 angstroms of silicon nitride. In yet another example, a PECVD process is used to deposit silicon oxide. The dielectric materials may be combined to form the passivation layer 213. In one example, a 300 angstrom layer of silicon oxide is deposited over a 100 angstrom layer of silicon nitride to form the passivation layer 213. The passivation layer 213 may include other dielectric materials such as zinc oxide, zirconium oxide, hafnium oxide or titanium oxide. These other dielectric material may also be deposited using CVD processes.

The passivation layer 213 is between about 300 angstrom to about 4000 angstroms. The thickness of the passivation layer 213 affects the minimum distance between the source contact and the gate. Because in this process the gate is formed before the source and drain, the present disclosure provides a "gate first" process.

Figure 6:
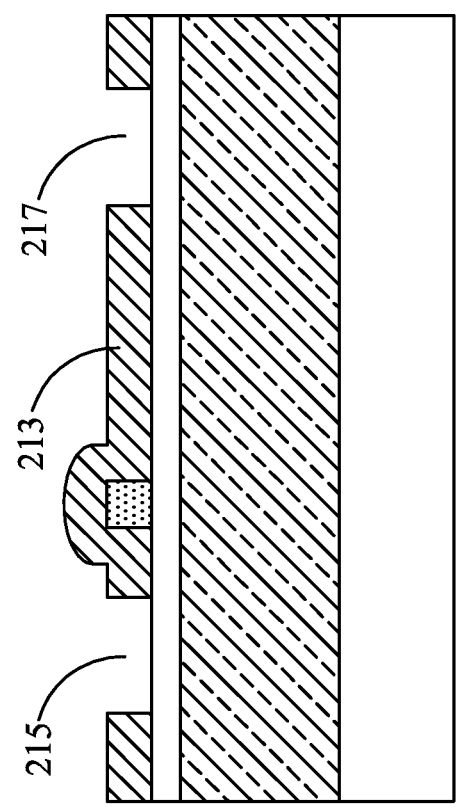

Referring to FIG. 1, in operation 111 a portion of the passivation layer is etched to form a source opening and a drain opening. In FIG. 6, the source opening 215 is shown on one side of the gate 211 and the drain opening 217 on the opposite side. The source opening 215 and the drain opening 217 may be referred to together as the ohmic openings. A photoresist is patterned over the passivation layer 215 to protect portions of the passivation layer 215, specifically, the passivation layer 215 around the gate 211. In some embodiments, the etch process is selected to have high etch selectivity of the passivation layer over the donor-supply layer 205 so that little or no removal of the donor-supply layer occurs when the passivation layer is completely etched. Because any remaining passivation layer 213 material can increase the on-resistance of the device, the process may over etch slightly to ensure a good surface for the ohmic contact. In certain embodiments, a portion of the donor-supply layer 205 is removed to create a source opening 215 and a drain opening 217 that include recesses in the donor-supply layer 205.

Referring to operation 113 of FIG. 1, ohmic metal layers are deposited over the workpiece. Two or more layers of ohmic metal may be deposited. In many embodiments, three metal layers are used. The ohmic metals are deposited conformally over the workpiece such that the bottom and sidewalls of the source and drain openings, the curve on the passivation layer above the gate, and the field areas of the passivation layer are covered. Successive layers of ohmic metal also conformally cover the previous metal layer. The metal layers are deposited using suitable deposition processes. The metal layers may be deposited by a physical vapor deposition (PVD) process, a metal CVD process, an electron gun process, or plating process. In many embodiments, the metal layers are deposited using a PVD process where metal particles sputter from a target material at around 200 degrees to about 450 degrees Celsius in the presence of plasma and deposit onto the workpiece. In some embodiments, the metal layers are deposited using an electron gun. While different deposition methods may be used to deposit each metal layer of the ohmic metal, for manufacturability reasons the metal layers are deposited using one method, often in different process chambers of one process tool.

FIG. 7 shows an example of partially fabricated HEMT with three metal layers (219, 221, and 223) in accordance with various embodiments of the present disclosure. In some embodiments, the metal layers have different thicknesses, which increases away from the silicon substrate 201. In other embodiments, the metal layers have about the same thickness. In still other embodiments, the metal layers have varying thicknesses where a first layer is thin, second layer is thicker, and the third layer is thin.

A three metal layer combination may include titanium, aluminum, and titanium layers. Another three metal layer combination includes titanium, aluminum, and titanium nitride layers. A two metal layer combination may include titanium and an aluminum alloy. Often aluminum alloys having a small percentage of copper are used in two or three layer ohmic metals. In one example, the aluminum alloy has about 0.05% to about 5% copper. A first titanium layer may have a thickness of about 100 angstroms to about 400 angstroms. A second aluminum alloy layer may have a thickness of about 600 angstroms to about 3000 angstroms. A third layer may have a thickness of about 100 angstroms to about 400 angstroms. According to various embodiments, the third layer may be nickel, copper, titanium, or titanium nitride.

Referring to FIG. 1, in operation 115 a portion of the ohmic metal layers are etched to form a source structure and a drain structure. An etch mask is patterned over the ohmic metal layers to protect the source structure and the drain structure during etching. A plasma etch removes unwanted portions of the ohmic metal layers. Because the ohmic metal layers include different materials, different etchants or even different etch processes may be used. However, the metal layers are likely etched in the same process chamber. The unwanted portions of the ohmic metal layers may be removed, for example, by an inductively coupled plasma (ICP) etch using a fluorine-based etchant, a bromine-based etchant, or a chlorine-based etchant. After the ohmic metal layers are etched, they may be annealed in a rapid thermal annealing (RTA) process at about 800 degrees to about 950 degrees Celsius for about 30 seconds to about 300 seconds.

According to various embodiments, the annealing forms an intermetallic compound. During the annealing, the metal elements from the ohmic metal may diffuse into the donor-supply layer 205 so that the intermetallic compound is partially embedded in the AlGaN layer 205. In one example, the intermetallic compound comprises Al, Ti, or Cu. In another example, the intermetallic compound comprises AN, TiN, Al$_3$Ti or AlTiN. The intermetallic compound may improve electrical connection between the source/drain features and the carrier channel. In one example, the intermetallic compound is formed in a recess of the AlGaN layer 205 such that the intermetallic compound has a non-flat top surface. In another example, intermetallic compound overlies a portion of the AlGaN layer 205.

FIG. 8 shows an example of partially fabricated HEMT with source structure 225 and drain structure 227 in accordance with various embodiments of the present disclosure. Portions of the metal layers 219, 221, and 223 are removed down to the passivation layer 213 in the drift region between the gate and the drain to separate the source structure 225 and the drain structure 227. Thus no conductive material remains between the source structure 225 and the drain structure 227. Portions of the metal layers 219, 221, and 223 are also removed away from the source opening and the drain opening to separate the transistor of FIG. 8 from any adjacent transistors.

Figure 9:
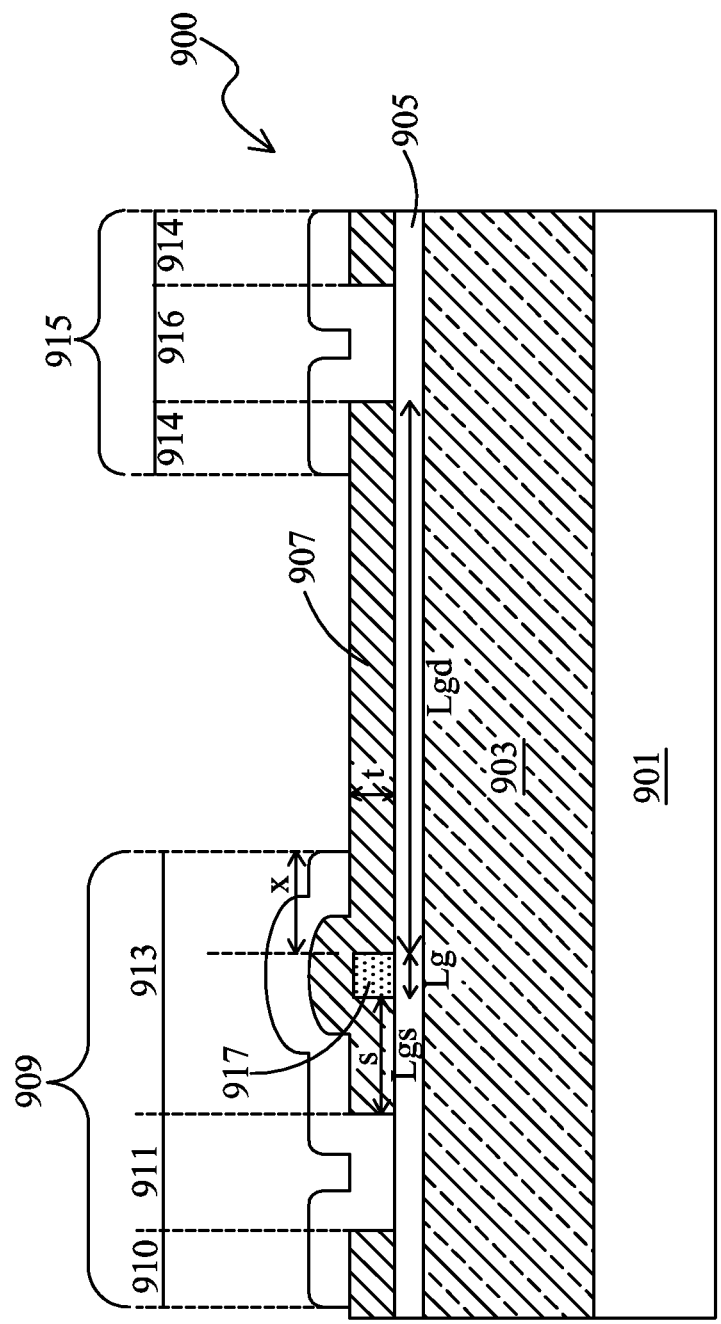
FIG. 9 is a cross sectional view of a high electron mobility transistor (HEMT) structure in accordance with various embodiments of the present disclosure.

FIG. 9 is a cross sectional view of a high electron mobility transistor (HEMT) structure 900 in accordance with various embodiments of the present disclosure and illustrates the source structure in more detail. The HEMT 900 includes a silicon substrate 901, a bulk UID GaN layer 903, a donor-supply layer 905 over the UID GaN layer, a gate 917, passivation layer 907 around the gate 917, a drain structure 915 over the donor-supply layer 915 in and around an opening of the passivation layer 907, and a source structure 909 over the donor-supply layer 915 in and around a source opening of the passivation layer 907 that is on an opposite side of the gate 917 from the drain structure 915. The passivation layer 907 has a thickness "t" that is substantially constant across the drift region of the HEMT 900. The thickness t may be somewhat higher or lower around the gate 917. The gate 917 has a length "$L_g$" that may vary at the contact portion (not shown) of the gate 917. Usually, the gate material at the contact portion of the gate is not covered by the passivation layer 907 and has a larger $L_g$ for ease of depositing a contact metal. In certain embodiments, the $L_g$ at active portions of the HEMT over the 2-DEG channel layer may be about or less than 0.45 micrometers.

The drain structure 915 includes a contact portion 916 disposed within and above a drain opening in the passivation layer 907 and may include one or more overhead portions 914 over the passivation layer 907. In certain embodiments, the top surface of the drain structure 915 is not planar because the overhead portion 914 is higher than the contact portion 916. In other embodiments, only the contact portion 916 is included as the drain structure 915. A contact metal (not shown) may be deposited over an overhead portion 914 of the drain structure 915 for forming the conductive connections to the interconnect structure of the circuit. A distance $L_{gd}$ between an edge of the drain contact portion 916 closest to the gate 917 and the closest edge of the gate structure 917 depends on the desired electrical properties of the HEMT. For example, for moderately high breakdown voltage devices, the $L_{gd}$ may be 20 micrometer or more. For lower breakdown voltage devices, the $L_{gd}$ may be about 10 micrometers.

The source structure 909 includes a contact portion 911 disposed within and above a source opening in the passivation layer 907, an overhead portion 913 over the passivation layer 907 between the source contact portion 911 and the drain structure 915, and may include an over head portion 910 over the passivation layer 907 away from the gate 917. The top surface of the source structure 909 is not planar because the overhead portion 913 is higher than the source contact portion 911. A contact metal (not shown) may be deposited over an overhead portion 910 of the drain portion of the drain structure 915 for forming the conductive connections to the interconnect structure of the circuit.

A distance "$L_{gs}$" is the distance between the source and the gate. As shown in FIG. 9, $L_{gs}$ is the length of the passivation layer 907 between an edge of the source contact portion 911 closest to the gate 917 and the closest edge of the gate structure 917. In order to minimize on-resistance, the $L_{gs}$ is minimized. According to various embodiments of the present disclosure, the $L_{gs}$ may be less than about 1 micrometer or less than about 0.2 micrometers. Using the manufacturing process disclosed herein, an $L_{gs}$ as small as half of the passivation layer thickness (t/2) can be achieved.

The overhead portion 913 of the source structure 909 can modulate the surface electric field at the gate edge during operation. A modulation distance between the overhead portion 913 and the gate is approximately the thickness t of the passivation layer 907. For modulating the surface electric field at the gate edge, a smaller distance between the overhead portion 913 and the gate is more effective. Because of the overhead portion 913 of the present disclosure is deposited directly on the passivation layer 907, a shorter modulation distance is achieved than processes that use a metal liftoff technique to create the source structure or those that use a first level metal interconnect as a field plate over the gate.

According to various embodiments, a dimension "x" of the source overhead portion 913 is measured from the gate edge closest to the drain structure 915, as shown in FIG. 9. The dimension x may be positive (toward the drain structure) or negative (toward the source contact portion) or zero (at the gate edge). In one embodiment, the dimension x is up to ⅔ $L_{gd}$. Thus, a portion of the overhead portion 913 over lays the passivation layer 907 in the drift region. In other embodiments, the dimension x is in the negative direction as much as twice the gate length $L_g$ but still less than $L_g+L_{gs}$. In other words, a length of the overhead portion 913 cannot be zero or less. According to some embodiments, the dimension x is greater than negative $L_g$, such that the overhead portion 913 overlaps a portion of the gate 917.

Figure 10A:
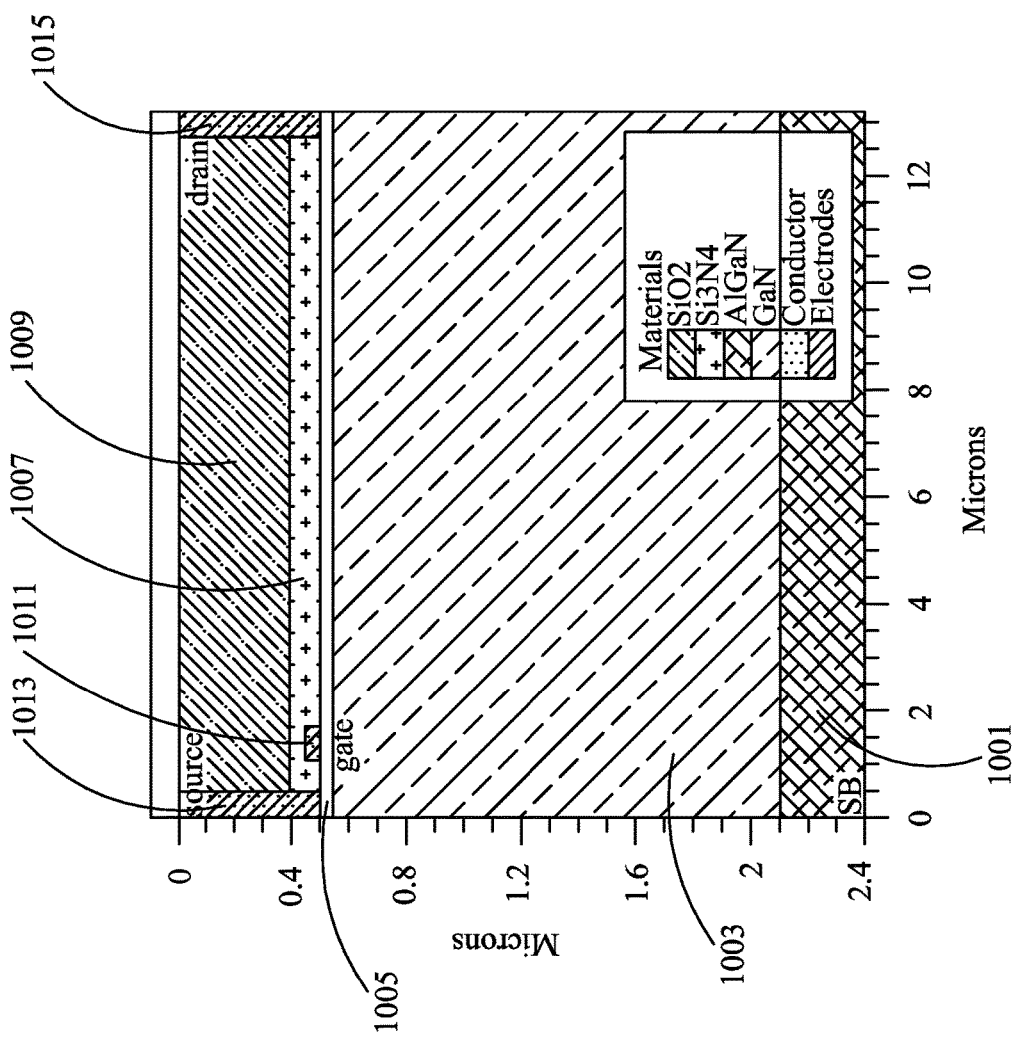
FIGS. 10A and 10B are modeled HEMT structures in accordance with various embodiments of the present disclosure.
Figure 10B:
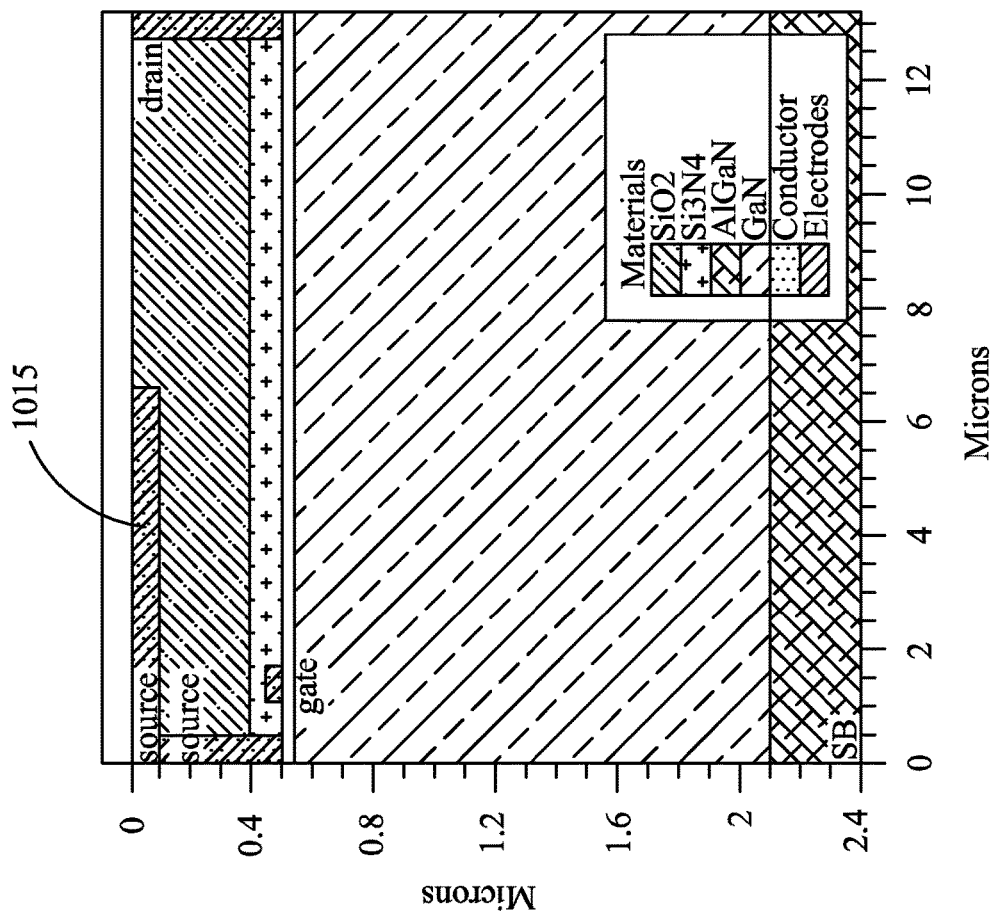

FIGS. 10A and 10B are modeled HEMT structures in accordance with various embodiments of the present disclosure. FIG. 10A shows a comparative HEMT structure having a substrate 1001 under a bulk GaN layer 1003. A gate 1011 is formed over an AlGaN layer 1005 over the bulk GaN layer 1003. A first passivation layer 1007 of silicon nitride at about 0.1 microns covers the gate 1001. A second passivation layer 1009 at about 0.4 microns is over the first passivation layer 1007. A source 1013 and a drain 1015 have a height of about 0.5 microns. The $L_{gs}$ is about 0.6 microns, $L_g$ about 0.5 microns, and $L_{gd}$ about 11 microns.

FIG. 10B shows a HEMT structure in accordance with various embodiments that has the same dimensions as the comparative HEMT structure of FIG. 10A except as to the source structure. The source structure 1017 HEMT structure of FIG. 10B includes an overhead portion that has a dimension x of about ½ $L_{gd}$.

Figure 10C:
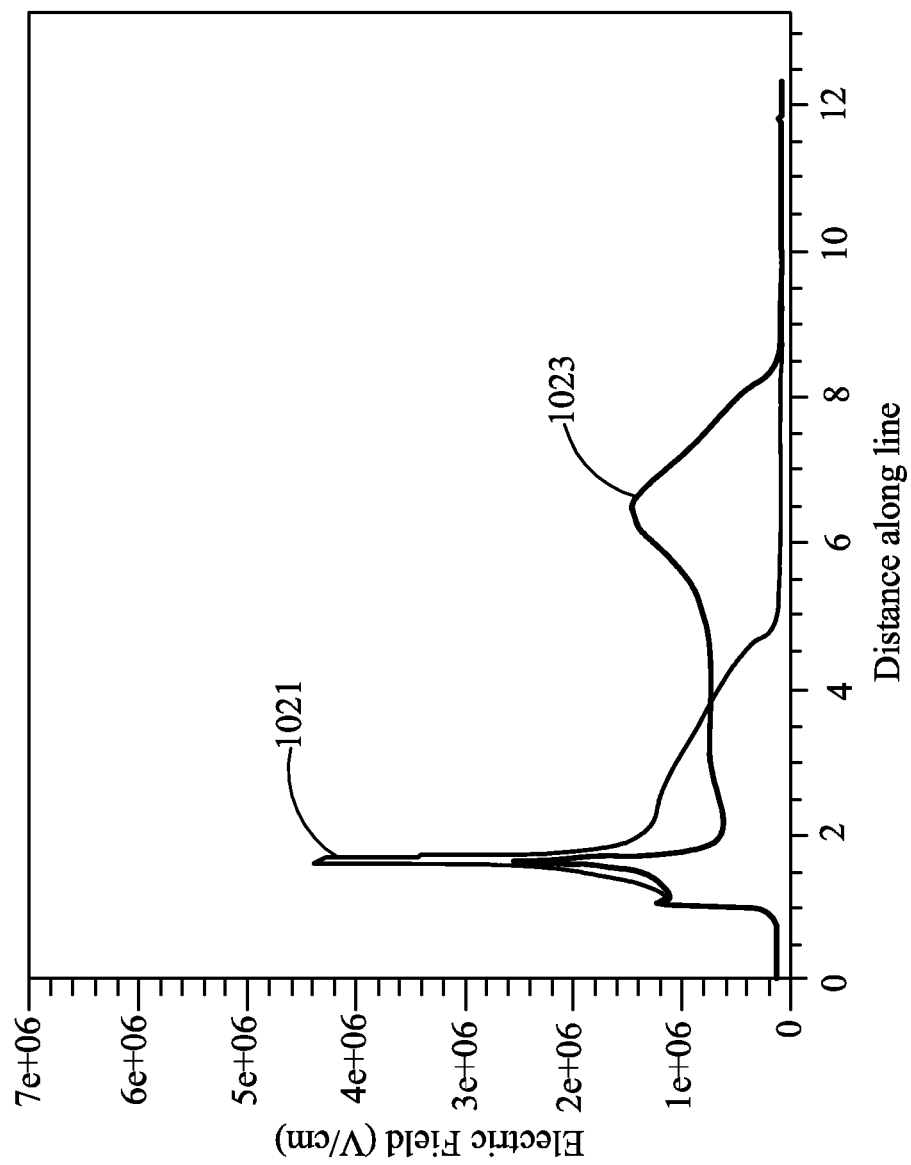
FIG. 10C is a plot of simulated peak surface electric field as a function of distance on the HEMT structures of FIGS. 10A and 10B.

FIG. 10C is a plot of simulated peak surface electric field as a function of distance on the HEMT structures in accordance with various embodiments of the present disclosure. Electric field in volts per centimeter is plotted against a distance along line across the HEMT. The simulation models a gate voltage of −5 volts and drain bias of 400 volts. The peak corresponds to the gate structure edge closest to the drain. Line 1021 is a simulated result for a comparative HEMT of FIG. 10A without the overhead portions of the source structure as disclosed herein. The peak electric field for line 1021 is almost 6E6 V/cm. Line 1023 is a simulated result for a HEMT of FIG. 10B having an overhead portion. The peak electric field for line 1023 is about 3E6 V/cm, for a reduction of about 50%. While the peak electric field value would vary depending on the structure modeled in the simulation, the relative effect of having an overhead portion clearly modulates the surface electric field.

The embodiments of the present disclosure may have other variations. For example, the overhead portion of the source structure may be combined with other metal features above to further modulate the surface electric field. For example, one or more interconnect metal layers above the overhead portion may be used to act as a field plate over the gate.

An aspect of this description is related to a circuit structure. The circuit structure includes a III-V semiconductor compound over a substrate, a AlxGa(1-X)N (AlGaN) layer over the III-V semiconductor compound, a gate over the AlGaN layer, a passivation film over the gate and over a portion of the AlGaN layer, a source structure, and a drain structure on an opposite side of the gate from the source structure. The source structure has a source contact portion and an overhead portion. X ranges from 0.1 to 1. The overhead portion is over at least a portion of the passivation film between the source contact portion and the gate. A distance between the source contact portion and the gate is less than a distance between the gate and the drain structure.

Another aspect of this description relates to a transistor. The transistor comprising a gallium nitride (GaN) layer over a substrate; an active layer over the GaN layer; a gate over the active layer; a passivation film over the gate and over the active layer; a source structure having a source contact portion and an overhead portion, wherein the overhead portion is over at least a portion of the passivation film between the source contact portion and the gate; and a drain structure on an opposite side of the gate from the source structure. A distance between the source contact portion and the gate is less than a distance between the gate and the drain structure.

A further aspect of this description relates to a semiconductor device. The semiconductor device comprising a III-V semiconductor layer over a substrate; an active layer over the III-V semiconductor layer; a gate over the active layer; a passivation film over the gate and over the active layer, wherein the passivation film has a first opening; a source structure comprising an overhead portion, wherein the overhead portion is over at least a portion of the passivation film between the first opening of the passivation film and the gate; and a drain structure on an opposite side of the gate from the source structure. A distance between the first opening of the passivation film and the gate is different than a distance between the gate and the drain structure.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   epitaxially growing a semiconductor layer over a silicon substrate;
   epitaxially growing a donor-supply layer over the semiconductor layer;
   forming a gate on the donor-supply layer;
   depositing a dielectric layer over the gate and the donor-supply layer;
   etching a portion of the dielectric layer to form a first opening and a second opening each of the first opening and the second opening exposing a portion of the donor-supply layer, wherein the first opening and the second opening are disposed on opposite sides of the gate;
   depositing one or more metal layers over the first opening, the second opening, and the dielectric layer; and
   etching a portion of the one or more metal layers to remove the one or more metal layers from a region of a top surface of the dielectric layer between the gate and the second opening thereby forming a source structure and a drain structure, wherein after the etching, the source structure comprises a source overhead portion disposed over at least a portion of the dielectric layer between the source structure and the gate.

2. The method of claim 1, wherein the depositing the one or more metal layers comprises:
   depositing a first metal layer including titanium; and
   depositing a second metal layer including aluminum over the first metal layer.

3. The method of claim 2, wherein the depositing the one or more metal layers further comprises depositing a third metal layer over the second metal layer.

4. The method of claim 3, wherein the third metal layer includes nickel, copper, titanium, or titanium nitride.

5. The method of claim 1, wherein depositing the dielectric layer comprises depositing a silicon nitride film using plasma enhanced chemical vapor deposition (PECVD), depositing a silicon nitride film using low pressure chemical vapor deposition (LPCVD), or depositing a silicon oxide film using PECVD.

6. The method of claim 1, wherein the dielectric layer is at least one of silicon nitride, silicon oxide, silicon oxynitride, carbon doped silicon oxide, carbon doped silicon nitride, carbon doped silicon oxynitrides, zinc oxide, zirconium oxide, hafnium oxide or titanium oxide.

7. The method of claim 1, wherein etching the portion of the one or more metal layers forms the source overhead portion overlapping at least the portion of the gate.

8. The method of claim 1, wherein the source overhead portion overlaps a portion of the dielectric layer over a drift region between the gate and the drain structure.

9. A method comprising:
   epitaxially growing a first semiconductor layer over a substrate;
   epitaxially growing a second semiconductor layer over the first semiconductor layer;
   forming a gate on the second semiconductor layer;
   depositing a passivation film over the gate and the first and second semiconductor layers;
   etching a first opening and a second opening in the passivation film, wherein the etching exposes the second semiconductor layer, and wherein the first opening and the second opening are disposed on opposite sides of the gate;
   depositing ohmic metal layers over the passivation film and in the first and second openings; and
   etching a portion of the ohmic metal layers to form a source structure and a drain structure, wherein the source structure comprises:
   a first portion disposed over the first opening; and
   a second portion extending over at least a portion of the passivation film between the first portion and the gate, wherein the second portion overlies at least a portion of the gate.

10. The method of claim 9, wherein etching the portion of the ohmic metal layers forms the second portion also overlying a portion of the passivation film in a drift region between the gate and the drain structure in the second opening.

11. The method of claim 9, wherein depositing the passivation film comprises depositing a silicon nitride film using plasma enhanced chemical vapor deposition (PECVD), depositing a silicon nitride film using low pressure chemical vapor deposition (LPCVD), or depositing a silicon oxide film using PECVD.

12. The method of claim 9, wherein etching the portion of the ohmic metal layers forms the drain structure comprising:
   a drain contact portion disposed in the second opening; and
   a drain overhead portion disposed over at least a portion of the passivation film between the drain structure and the gate.

13. The method of claim 9, wherein the depositing the ohmic metal layers and etching the ohmic layers forms the second portion of the source structure directly on the passivation film.

14. A method comprising:
   epitaxially growing a semiconductor layer over a substrate;
   epitaxially growing a donor-supply layer over the semiconductor layer;
   forming a gate over the donor-supply layer;
   forming a passivation layer over the gate, wherein the passivation layer has a first opening on a first side of the gate and a second opening on a second side of the gate opposite the first side of the gate;
   conformally depositing one or more metal layers over the first opening, the second opening, and the passivation layer; and
   etching the one or more metal layers to form a third opening in the one or more metal layers, wherein the third opening exposes the passivation layer and is disposed between the gate and the second opening of the passivation layer,
   wherein after the etching the one or more metal layers contiguously extend from the first opening to a first distance on the second side of the gate.

15. The method of claim 14, further comprising:
   forming a channel between the semiconductor layer and the donor-supply layer.

16. The method of claim 14, wherein the etching the one or more metal layers to form the third opening includes:
   forming an etch mask over the first opening and the second opening; and
   plasma etching the third opening while the etch mask is over the first and second openings.

17. The method of claim 14, wherein etching the one or more metal layers includes etching a plurality of metals in a same chamber.

18. The method of claim 14, wherein etching the one or more metal layers includes an inductively coupled plasma (ICP) etch using at least one of a fluorine-based etchant, a bromine-based etchant, or a chlorine-based etchant.

19. The method of claim 14, further comprising:
   after the etching, annealing the substrate including the etched one or more metal layers.

20. The method of claim 14, wherein the forming the passivation layer includes depositing a dielectric material and etching the first opening and the second opening in the dielectric material to expose the donor-supply layer.

* * * * *